United States Patent
Ohtani et al.

(10) Patent No.: US 10,116,112 B2
(45) Date of Patent: Oct. 30, 2018

(54) LASER OSCILLATOR

(71) Applicant: Via Mechanics, Ltd., Kanagawa (JP)

(72) Inventors: Nobuyoshi Ohtani, Kanagawa (JP); Goichi Ohmae, Kanagawa (JP)

(73) Assignee: VIA MECHANICS, LTD., Kanagawa (JP)

( * ) Notice: Subject to any disclaimer, the term of this patent is extended or adjusted under 35 U.S.C. 154(b) by 0 days.

(21) Appl. No.: 15/654,335

(22) Filed: Jul. 19, 2017

(65) Prior Publication Data

US 2018/0034229 A1    Feb. 1, 2018

(30) Foreign Application Priority Data

Jul. 28, 2016  (JP) ................. 2016-148073
May 29, 2017  (JP) ................. 2017-105582

(51) Int. Cl.

| H01S 3/041 | (2006.01) |
|---|---|
| H01S 3/00 | (2006.01) |
| H01S 3/22 | (2006.01) |
| H01S 3/038 | (2006.01) |
| H01S 3/063 | (2006.01) |
| H01S 3/03 | (2006.01) |
| H01S 3/034 | (2006.01) |
| H01S 3/04 | (2006.01) |
| H03B 17/00 | (2006.01) |

(52) U.S. Cl.
CPC ............ *H01S 3/041* (2013.01); *H01S 3/0071* (2013.01); *H01S 3/034* (2013.01); *H01S 3/0315* (2013.01); *H01S 3/0384* (2013.01); *H01S 3/0401* (2013.01); *H01S 3/0402* (2013.01); *H01S 3/063* (2013.01); *H01S 3/22* (2013.01); *H03B 17/00* (2013.01)

(58) Field of Classification Search
CPC ........ H01S 3/041; H01S 3/0401; H01S 3/034; H01S 3/0071; H01S 3/063; H01S 3/0384; H01S 3/22; H01S 3/0315; H03B 17/00
See application file for complete search history.

(56) References Cited

U.S. PATENT DOCUMENTS

| 5,131,003 | A | * | 7/1992 | Mefferd | ................ | H01S 3/0315 |
|---|---|---|---|---|---|---|
|  |  |  |  |  |  | 372/64 |
| 5,131,004 | A | * | 7/1992 | Dallarosa | .............. | H01S 3/0315 |
|  |  |  |  |  |  | 372/64 |
| 5,140,606 | A |  | 8/1992 | Yarborough et al. | | |

(Continued)

FOREIGN PATENT DOCUMENTS

| JP | 02068972 A | * | 3/1990 | ............ | H01S 3/086 |
|---|---|---|---|---|---|
| JP | 2002084021 A |  | 3/2002 | | |

*Primary Examiner* — Yuanda Zhang
(74) *Attorney, Agent, or Firm* — Nixon Peabody LLP; Eduardo J. Quiñones

(57) ABSTRACT

In a laser oscillator, a pair of electrodes is disposed in a housing into which a gas is sealed, a waveguide is formed by the pair of electrodes, and a laser beam is configured to be extracted from an end of the housing. The laser oscillator includes a mirror holder attached to an end of the electrode, the end serving as an end of the waveguide, and a reflection mirror attached to the mirror holder and reflecting a laser beam generated in the waveguide. In the laser oscillator, a passage through which a cooling medium is passed is formed inside each of the pair of electrodes.

4 Claims, 4 Drawing Sheets

(56) References Cited

U.S. PATENT DOCUMENTS

| | | | | |
|---|---|---|---|---|
| 5,216,689 A * | 6/1993 | Gardner | ................ | H01S 3/0315 372/103 |
| 5,220,576 A * | 6/1993 | Krueger | ................ | H01S 3/0315 372/107 |
| 5,231,644 A * | 7/1993 | Krueger | ................ | H01S 3/0315 372/107 |
| 5,335,242 A * | 8/1994 | Hobart | .................. | H01S 3/0315 372/64 |
| 5,353,297 A * | 10/1994 | Koop | ................... | H01S 3/0315 372/55 |
| 5,386,431 A * | 1/1995 | Tulip | .................... | H01S 3/0315 359/346 |
| 5,894,493 A * | 4/1999 | Sukhman | ............. | H01S 3/0315 372/34 |
| 2004/0066825 A1* | 4/2004 | Hayashikawa | ........... | H01S 3/03 372/55 |
| 2005/0175054 A1* | 8/2005 | Shackleton | ........... | H01S 3/0315 372/55 |

* cited by examiner

LASER OSCILLATOR

CROSS-REFERENCE TO RELATED APPLICATION

The present application claims priority from Japanese Patent Applications No. 2016-148073 filed on Jul. 28, 2016 and No. 2017-105582 filed on May 29, 2017, the contents of which are hereby incorporated by reference into this application.

TECHNICAL FIELD OF THE INVENTION

The present invention relates to a laser oscillator generating a laser beam for drilling a hole and the like in a workpiece such as a printed board, and particularly to a laser oscillator in which an attachment structure of a reflection mirror is improved.

BACKGROUND OF THE INVENTION

As a laser oscillator, a laser oscillator having a structure in which a waveguide is formed by disposing upper and lower electrodes facing each other in an airtight container in which a laser medium gas is sealed and plasma discharge is generated between the electrodes has been known. In the laser oscillator with this structure, the plasma discharge causes an electronic state of an atom in gas to be excited, and optical resonation is caused by the reflection mirrors arranged at each end of the electrodes. A laser beam based on the optical resonation is configured to be extracted outside a window. Accordingly, in a case where a direction of the reflection mirror is not properly adjusted, stability of laser output and a position of a laser beam may be deteriorated.

In a conventional laser oscillator, as disclosed in Japanese Patent Application Laid-Open Publication No. 2002-84021 (Patent Document 1) and U.S. Pat. No. 5,140,606 (Patent Document 2), for example, a pan-tilt motion mechanism making each reflection mirror move left or right and up or down by a deformable thin plate and tension of a screw is configured at both ends of a housing of the laser oscillator, and a direction of each of the reflection mirrors is adjusted. In such attachment structure of the reflection mirror, the pan-tilt motion mechanism becomes complicated, and in order to cool heat of the reflection mirror generated by making a laser beam reflect, the attachment structure needs to be specially devised.

SUMMARY OF THE INVENTION

Thus, an object of the present invention is to provide a laser oscillator having a simple attachment structure of the reflection mirror and which does not require specially devising to cool the reflection mirror.

Of inventions disclosed in the present application, as a representative laser oscillator, a laser oscillator in which a pair of electrodes is disposed in a housing into which a gas is sealed, a waveguide is formed by the pair of electrodes, and a laser beam is configured to be extracted from an end of the housing, the laser oscillator includes a mirror holder attached to an end of the electrode, the end serving as an end of the waveguide, and a reflection mirror attached to the mirror holder and reflecting a laser beam generated in the waveguide. In the laser oscillator, a passage through which a cooling medium is passed is formed inside each of the pair of electrodes.

According to the present invention, it becomes possible to achieve a laser oscillator having a simple attachment structure of the reflection mirror and which does not require specially devising to cool the reflection mirror.

BRIEF DESCRIPTIONS OF THE DRAWINGS

FIG. 3A and FIG. 3B are front views of a bracket side of FIG. 2, when the bracket is seen from the left of the paper on which FIG. 4 is a view illustrating an entire schematic structure of the laser oscillator according to the one embodiment of the present invention.

DETAILED DESCRIPTION

Figure 1A:
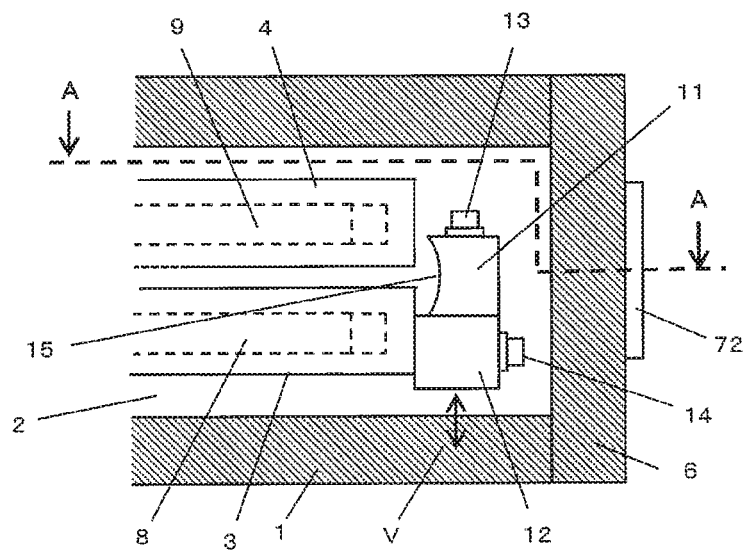
FIG. 1A is a longitudinal cross-sectional view of an end as a laser beam extraction side of a laser oscillator according to one embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 4:
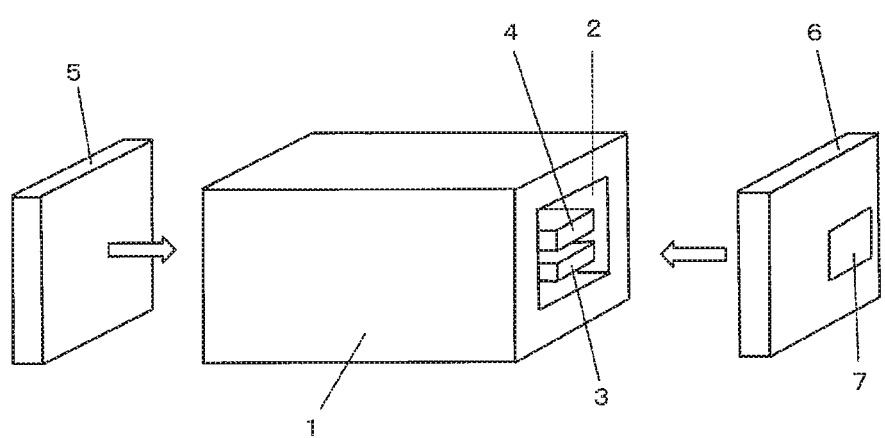
FIG. 4 is illustrated.

FIG. 4 is a view illustrating an entire schematic structure of a laser oscillator according to one embodiment of the present invention. In FIG. 4, a discharge chamber 2 in which a laser medium gas is sealed is formed from one end side to the other side inside a rectangular tubular housing 1 made of metal. A pair of electrodes 3 and 4 facing each other is arranged in the discharge chamber 2 to form a waveguide. Each of brackets 5 and 6 for sealing is attached to each end of the rectangular tubular housing 1. The bracket 6 is provided with a light emitting portion 7 for discharging a laser beam generated in the discharge chamber 2 outside.

Figure 1B:
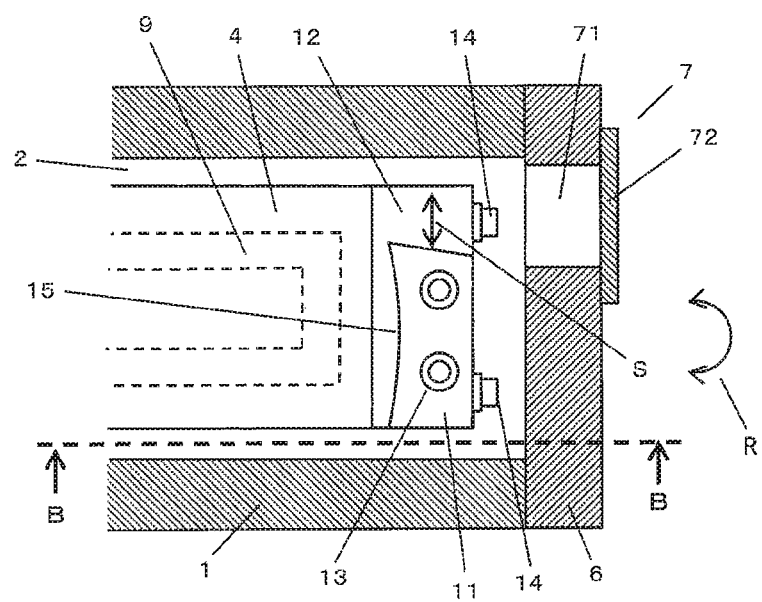
FIG. 1B is a transverse cross-sectional view of the end as the laser beam extraction side of the laser oscillator according to one embodiment of the present invention.

FIGS. 1A and 1B are cross-sectional views of a bracket 6 side provided on a laser beam extraction side of the laser oscillator in FIG. 4. More specifically, FIG. 1A is a longitudinal cross-sectional view of an end as the laser beam extraction side of the laser oscillator according to one embodiment of the present invention, and FIG. 1B is a transverse cross-sectional view of the end as the laser beam extraction side of the laser oscillator according to one embodiment of the present invention. Moreover, FIG. 1A is a cross-sectional view taken along a B-B line of FIG. 1B, and FIG. 1B is a cross-sectional view taken along an A-A line of FIG. 1A. In FIGS. 1A and 1B, the same reference numerals as those in FIG. 4 indicate the same components.

In FIGS. 1A and 1B, cooling water passages 8 and 9 are formed inside the electrodes 3 and 4, respectively. Reference numeral 71 denotes a hole drilled in the light emitting portion 7 of the bracket 6. Reference numeral 72 denotes a transmitting member attached to the light emitting portion 7 of the bracket 6. Reference numeral 11 denotes a reflection mirror reflecting a laser beam generated inside the discharge chamber 2. The reflection mirror 11 may be cylindrical type or spherical type. Reference numeral 12 denotes a mirror holder to which the reflection mirror 11 is directly fixed via screws 13 in a surface contact manner, and the mirror holder 12 is directly fixed to an end of the lower electrode 3 via screws 14 in a surface contact manner. Respective screw holes of the refection mirror 11 and the mirror holder 12 in which the screws 13 and 14 are respectively inserted are formed to be larger than each diameter of the screws.

Figure 2A:
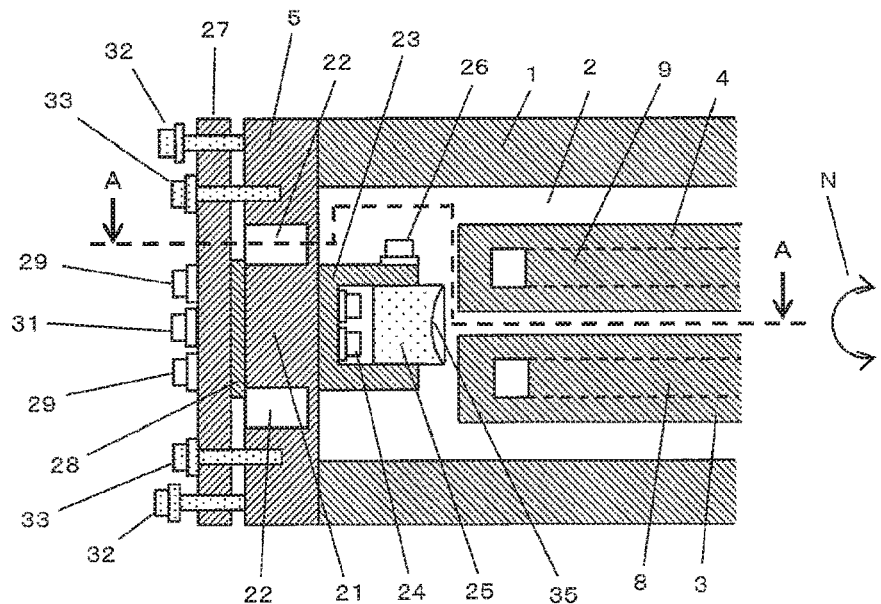
FIG. 2A is a longitudinal cross-sectional view of an end on a side opposite to the laser beam extraction side of the laser oscillator according to the one embodiment of the present invention.
Figure 2B:
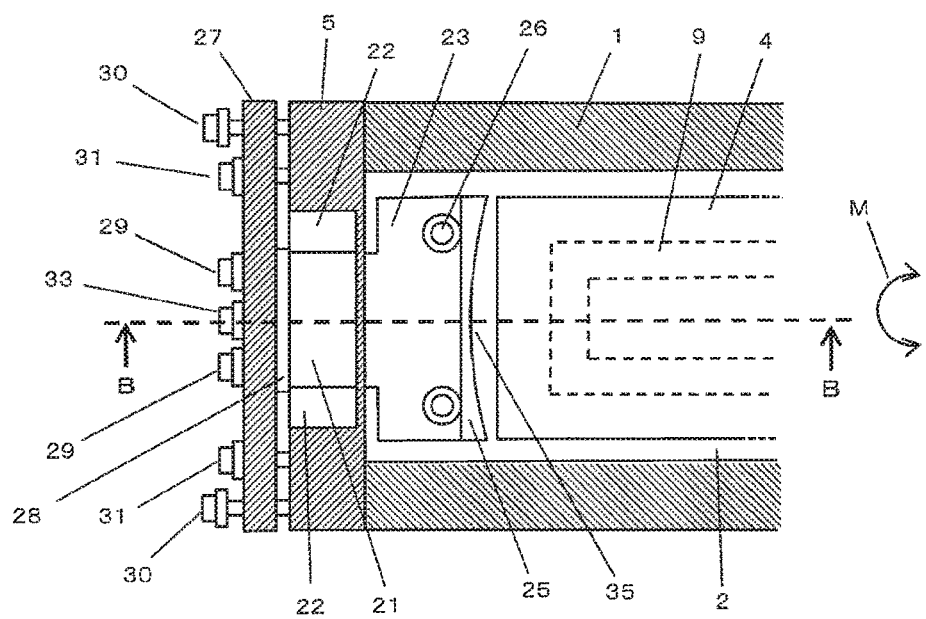
FIG. 2B is a transverse cross-sectional view of the end on the side opposite to the laser beam extraction side of the laser oscillator according to the one embodiment of the present invention.
Figure 3A:
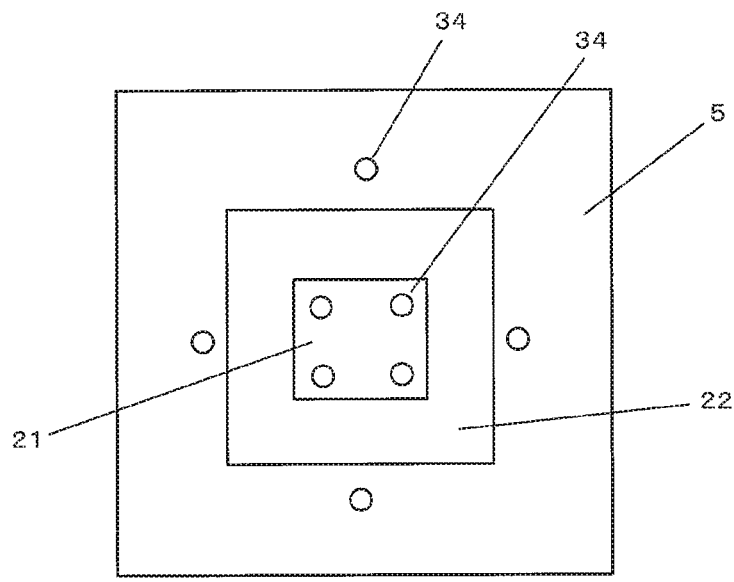
Figure 3B:
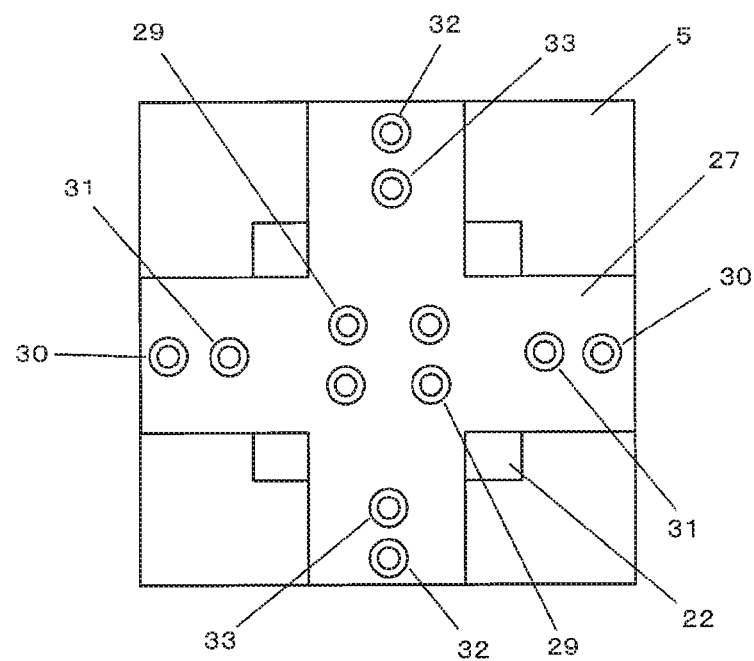

FIGS. 2A and 2B are cross-sectional views of an end on a bracket 5 side opposite to the laser beam extraction side of the laser oscillator in FIG. 4. More specifically, FIG. 2A is a longitudinal cross-sectional view of the end on the side opposite to the bracket 6 side of the laser oscillator according to one embodiment of the present invention, and FIG. 2B is a transverse cross-sectional view of the end on the side opposite to the bracket 6 side of the laser oscillator according to one embodiment of the present invention. Moreover, FIG. 2A is a cross-sectional view taken along a B-B line of FIG. 2B, and FIG. 2B is cross-sectional view taken along an A-A line of FIG. 2A. In addition, FIGS. 3A and 3B are front views of the bracket 5 side opposite to the laser beam extraction side in FIG. 4, when the bracket 5 is seen from the left of the paper on which FIG. 4 is illustrated. More specifically, FIG. 3A is a front view of the only bracket 5 of the laser oscillator according to the one embodiment of the present invention, when the bracket 5 is seen from the left of the paper on which FIG. 4 is illustrated, and FIG. 3B is an entire view of the bracket 5 side of the laser oscillator according to the one embodiment of the present invention, when the bracket 5 is seen from the left of the paper on which FIG. 4 is illustrated. In FIGS. 2A and 2B and FIGS. 3A and 3B, the same reference numerals as those in FIGS. 1 and 4 indicate the same components.

In FIGS. 2A and 2B and FIGS. 3A and 3B, in a side surface of the bracket 5 serving as an outside of the discharge chamber 2, a groove 22 is formed in such away that a rectangular central portion 21 remains, and a mirror holder 23 is fixed to a back surface of the central portion 21 via screws 24. Reference numeral 25 denotes a reflection mirror reflecting a laser beam on the bracket 5 side, and the reflection mirror 25 is fixed to the mirror holder 23 via screws 26 in such a way that the reflection mirror 25 is held to be enwrapped by the mirror holder 23. The reflection mirror 25 may be cylindrical type or spherical type, similarly to the reflection mirror 11.

A mirror adjustment member 27 for adjusting an angle of the reflection mirror 25 is fixed to the central portion 21 interposing a spacer 28 via screws 29. A threaded hole is formed in a position of the mirror adjustment member 27 where the screw 29 is inserted.

As illustrated in FIG. 3B, the mirror adjustment member 27 has a cross shape and is provided with screws 30 and 31 at each end thereof in a horizontal direction. The screw 30 disposed outside has a threaded hole in the mirror adjustment member 27, and when the screw 30 is tightened, the screw 30 works in such a way that the mirror adjustment member 27 moves farther from the bracket 5. In contrast, the screw 31 disposed inside has a threaded hole in the bracket 5, and when the screw 31 is tightened, the screw 31 works in such a way that the mirror adjustment member 27 moves toward the bracket 5.

In addition, the mirror adjustment member 27 is provided with screws 32 and 33 at each end thereof in a vertical direction. The screw 32 disposed outside has a threaded hole in the mirror adjustment member 27, and when the screw 32 is tightened, the screw 32 works in such a way that the mirror adjustment member 27 moves farther from the bracket 5. In contrast, the screw 33 disposed inside has a threaded hole in the bracket 5, and when the screw 33 is tightened, the screw 33 works in such a way that the mirror adjustment member 27 moves toward the bracket 5.

Note that, in FIG. 3A, reference numeral 34 denotes a threaded hole formed in the bracket 4.

In the above-described structure, work of adjusting a mirror surface 15 of the reflection mirror 11 on the laser beam extraction side is performed as follows, before incorporating the electrodes 3 and 4 into the tubular housing 1, in a state in which the electrodes 3 and 4 are coupled to each other with a predetermined interval by a supporting member not illustrated.

More specifically, in FIGS. 1A and 1B, the screw 13 is loosened to make the reflection mirror 11 slide in an S direction or rotate in an R direction, so that a reflection angle of the laser beam with respect to the horizontal direction (the direction parallel to the surface of the electrode) is adjusted. In addition, the screw 14 is loosened to make the reflection mirror 11 slide in a V direction, so that a reflection angle of the laser beam with respect to the vertical direction (the direction vertical to the surface of the electrode) is adjusted.

Moreover, in order to secure stability of laser output which is extracted outside and a position of a laser beam, work of adjusting a mirror surface 35 of the reflection mirror 25 provided on the side opposite to the laser beam extraction side is also required as a matter of course. This work is performed as follows, after the electrodes 3 and 4 are incorporated in the tubular housing 1, the bracket 6 is then attached to the tubular housing 1 by a fixing member not illustrated, and then, the bracket 5 to which the mirror holder 23 and the mirror adjustment member 27 are attached as described above is attached to the tubular housing 1 by a fixing member not illustrated.

More specifically, in FIGS. 2A and 2B, since a portion where the groove 22 of the bracket 5 is formed is thin, the central portion 21 is likely to incline in some degree by a moderate pressure from outside. Accordingly, by adjusting a tightening state of each of the screws 30 and 31 provided on both ends of the mirror adjustment member 27 in the horizontal direction, the reflection mirror 25 is rotated in an M direction via the central portion 21, so that the reflection angle of the laser beam with respect to the horizontal direction (the direction parallel to the surface of the electrode) is adjusted. In addition, by adjusting a tightening state of each of the screws 32 and 33 provided on both ends of the mirror adjustment member 27 in the vertical direction, the reflection mirror 25 is rotated in an N direction in the same manner described above, so that the reflection angle of the laser beam with respect to the vertical direction (the direction vertical to the surface of the electrode) is adjusted.

According to the above embodiment, the refection mirror 11 provided on the laser beam extraction side has a structure that the refection mirror 11 is only attached to the electrode 3 via the mirror holder 12, and by loosening the screws 13 and 14, the mirror surface 15 of the reflection mirror 11 can be adjusted. In addition, since the mirror holder 12 is directly fixed to the electrode 3 which is cooled by the water passage 8 in a surface contact manner and the reflection mirror 11 is directly fixed to the mirror holder 12 in a surface contact manner, cooling of the refection mirror 11 is performed enough. Accordingly, an attachment structure of the reflection mirror 11 provided on the laser beam extraction side becomes so simpler.

Moreover, according to the above embodiment, since the work of adjusting the angle of the reflection mirror performed to secure stability of laser output which is extracted outside and a position of the laser beam is configured to be performed from outside of the laser oscillator only with respect to the reflection mirror 25 provided on the side opposite to the laser beam extraction side, an effect that adjustment work becomes so simple is obtained.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A laser oscillator in which a pair of electrodes is disposed in a housing into which a gas is sealed, a waveguide is formed by the pair of electrodes, and a laser beam is configured to be extracted from an end of the housing, the laser oscillator comprising:
   a mirror holder directly attached to an end of one of the pair of electrodes, the end serving as an end of the waveguide, so that the mirror holder is capable of sliding on a surface of the end of the one of the pair of electrodes in a vertical direction with respect to a direction of the laser beam; and
   a reflection mirror attached to the mirror holder and reflecting a laser beam generated in the waveguide,
   wherein a passage through which a cooling medium is passed is formed inside each of the pair of electrodes.

2. The laser oscillator according to claim 1,
   wherein the mirror holder is attached to the end of the one of the pair of electrodes on a laser beam extraction side.

3. The laser oscillator according to claim 2,
   wherein a reflection mirror reflecting the laser beam generated in the waveguide and capable of adjusting a mirror surface from an outside of the housing is attached on a side opposite to the laser beam extraction side of the housing.

4. The laser oscillator according to claim 2,
   wherein a mirror surface of the reflection mirror attached to the end of the one of the pair of electrodes on the laser beam extraction side is adjusted before the electrode is incorporated into the housing.

* * * * *